US007966591B2

(12) United States Patent
Thompson et al.

(10) Patent No.: US 7,966,591 B2
(45) Date of Patent: Jun. 21, 2011

(54) SYSTEM AND METHOD FOR VERIFYING RACE-DRIVEN REGISTERS

(75) Inventors: John Thompson, Chippewa Falls, WI (US); Michael Bye, Chippewa Falls, WI (US)

(73) Assignee: Cray, Inc., Seattle, WA (US)

( * ) Notice: Subject to any disclaimer, the term of this patent is extended or adjusted under 35 U.S.C. 154(b) by 429 days.

(21) Appl. No.: 12/248,765

(22) Filed: Oct. 9, 2008

(65) Prior Publication Data
US 2010/0095255 A1    Apr. 15, 2010

(51) Int. Cl.
  *G06F 9/455*    (2006.01)
  *G06F 17/50*    (2006.01)
(52) U.S. Cl. ........ 716/106; 716/100; 716/101; 716/103; 716/104; 716/107; 716/110; 716/111; 716/112; 716/116; 716/117; 716/118; 716/136
(58) Field of Classification Search .......... 716/100–104, 716/106–107, 110–112, 116–118, 136
See application file for complete search history.

(56) References Cited

U.S. PATENT DOCUMENTS

| | | | |
|---|---|---|---|
| 6,536,019 B1 * | 3/2003 | Ouyang | 716/136 |
| 7,107,553 B2 * | 9/2006 | Lockyear et al. | 716/106 |
| 7,240,303 B1 | 7/2007 | Schubert et al. | |
| 7,243,319 B2 | 7/2007 | Ouyang | |
| 7,331,007 B2 * | 2/2008 | Fine et al. | 714/741 |

OTHER PUBLICATIONS

Abts, D., et al., "Verifying Large-Scale Multiprocessore Using an Abstract Verification Environment", *Proceedings. 36th Design Automation Conference, IEEE*, (1999), 163-168.
Burch, J. R., et al., "Symbolic Model Checking: 10 20 States and Beyond", *Proceedings of the Fifth Annual IEEE Symposium on Logic in Computer Science*, (1990), 1-33.
Eiriksson, A., "Integrating formal verification methods with a conventional project design flow", *33rd Design Automation Conference Proceedings, IEEE*, (1996), 666-671.
Eiriksson, A., "The Formal Design of 1M-gate ASICs", *Formal Methods in System Design*, 16(1), (2000), 7-22.
Jonsson, B., et al., "Compositional specification and verification of distributed systems", *ACM Transactions on Programming Languages and Systems (TOPLAS)*, 16(2), (1994), 259-303.
Slater, Brian, et al., "Complex Register Verification Utilizing RVM Based Register Abstraction Layer (RAL)", (2006), 32 pgs.
Wang, Dong, et al., "Automatic assume guarantee analysis for assertion-based formal verification", *Proceedings of the ASP-DAC 2005. Asia and South Pacific Design Automation Conference*, vol. 1, (2005), 561-566.

* cited by examiner

*Primary Examiner* — Nghia M Doan
(74) *Attorney, Agent, or Firm* — Schwegman, Lundberg & Woessner, P.A.

(57) ABSTRACT

Embodiments include a system and method for generating RTL description of an electronic device provided for a design test and a test bench environment to drive stimulus into the electronic device, identifying at least one register to be verified during the design test, authoring a property list including a plurality of properties, wherein each property includes a cause and an effect, creating a new property instance upon receiving an enqueue cause, transitioning a property instance from a waiting state to a pending state based on a dequeue cause, advancing property instances from the pending state to an active state and then to an expired state based on a defined time window, creating a current solution space including a plurality of solutions, wherein each of the plurality of solutions includes a list of unused active effects, inserting property instances into each of the plurality of solutions when the property instance enters to active state, pruning solutions from the current solutions space which have not used a property instance entering the expired state, and computing a new solution space based on the current solution space and target transition.

20 Claims, 10 Drawing Sheets

US 7,966,591 B2

SYSTEM AND METHOD FOR VERIFYING RACE-DRIVEN REGISTERS

FIELD OF THE INVENTION

The disclosure is related to functional design verification of logic design, and more particularly to verify storage elements.

BACKGROUND INFORMATION

Modern electronic and computing systems have large numbers of subsystems, with potentially millions of gates and registers. As design complexity and integration increases, verification challenges compound leading to an unmanageable verification environment. Testing and verifying such electronic and computing systems quickly becomes difficult, impeding the design process. Efficient methodologies like the SystemVerilog based Verification Methodology Manual (VMM) define best practices and help guide verification engineers in the construction of reusable simulation components and environments. The VMM allows for additional functionality to be added through frameworks that have targeted register verification like the Register Abstraction Layer (RAL) from Synopsys, Mountain View, Calif.

DETAILED DESCRIPTION OF THE INVENTION

Figure 1:
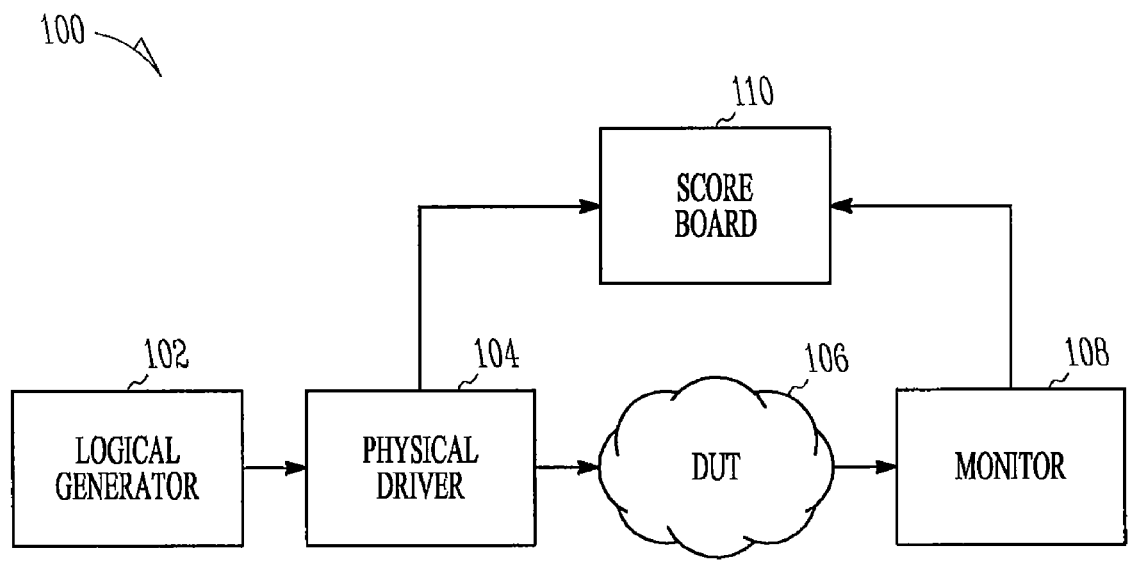
FIG. 1 illustrates a functional block diagram of a simulation environment, according to some embodiments.

In the following detailed description of the various embodiments, reference is made to the accompanying drawings which form a part hereof, and in which is shown by way of illustration specific embodiments in which the invention may be practiced. It is to be understood that other embodiments may be utilized and structural changes may be made without departing from the scope of the present invention. Embodiments of the present invention as illustrated in any of the accompanying drawing are not limited to the embodiments as depicted in any particular one of the accompanying drawings, and may include elements, features, and embodiments as described herein and as illustrated in any other of the accompanying drawings in combination with the elements, features and embodiments shown in the particular drawing.

When output behavior of a circuit cannot be precisely predicted based solely on the input stimulus driven into the circuit, then a "race condition" is said to be present. A common area where race conditions exist is in the verification of on-chip storage elements. It is common for storage elements, such as memory-mapped configuration and status registers, to be driven by multiple data paths resulting in scenarios where one cannot determine the state of such an element without mimicking the underlying timing of the data path circuitry. As transistor geometries continue to shrink, the landscape of functional verification is becoming increasingly complex, often resulting in ever increasing design complexity and time required to validate pre-silicon designs.

Embodiments provided herein include a method and system for verifying race-driven registers. Also included is a method and system that allows for the dynamic resolution of complex race conditions and eliminates the need to mimic hardware timing. In some embodiments, a Bounded Racy Cause and Effect (BRaCE) register verification co-framework is used to provide a user-friendly way of describing target storage elements as well as how they should behave when subjected to various stimuli. In some embodiments, BRACE uses a time bounded cause and effect approach in which the framework is able to determine whether register behavior could account for and be accounted for by the associated observed stimulus.

Simulation is the most widely adopted verification approach due to its simplicity and ability to scale to very large problem sizes. In integrated circuit design, Register Transfer Level (RTL) description is a way of describing the operation of a synchronous digital circuit. In RTL description, a circuit's behavior is defined in terms of the flow of signals (or transfer of data) between hardware registers, and the logical operations performed on those signals. Register transfer level abstraction is used in hardware description languages (HDLs) like Verilog and Very high speed integrated circuits Hardware Description Language (VHDL) to create high-level representations of a circuit, from which lower-level representations and ultimately actual wiring can be derived.

While a constrained-random verification (CRV) methodology provides the benefit of efficiently exploring large number of states in a system, it lacks the completeness of formal methods. In practice, random simulation is supplemented with assertions (properties) embedded throughout the Register Transfer Level (RTL) to verify that the implementation obeys its specified behavior, with code and functional coverage used to grade the effectiveness of the stimulus. Traditionally, the two methodologies are complimentary. However, there are a number of verification scenarios that are not easily addressed by either approach. The presence of multiple racing data paths introduces non-determinism into the test-bench environment making it difficult or impossible to predict the expected behavior a priori. An example of a circuit exhibiting a high degree of non-determinism includes is a random arbiter whose inputs are allowed to carry aliasing values. In this case, one is not able to predict the set of next possible outputs as one of n values, where n is the number of inputs to the arbiter, without intimate knowledge of the circuit's internal state. The design of a large-scale multiprocessor has many points of arbitration that introduce non-determinism into the DUT's (Devices Under Test) behavior. Non-determinism within a DUT can greatly increase the complexity associated with creating the self checking components of a simulation environment. In its absence, expected output state can often be easily computed directly from the generated input stimulus; however, when present, the resulting uncertainties must be resolved in order to correctly validate DUT behavior.

Race conditions within the DUT can increase the complexity associated with creating the model that will observe input stimulus and compute expected output behavior. In the absence of race conditions, the set of correct outputs will be deterministic with respect to the DUT's interfaces. However, race conditions can introduce ambiguity when predicting the correct output.

The system and method provided herein includes a BRaCE framework that allows for dynamic resolution, concurrent with the logic simulation to greatly simplify the verification of DUTs with a characteristic non-zero amount of non-determinism associated with them. BRaCE merges formal analysis with simulation tools to deal with this non-determinism and perform on-the-fly dynamic verification. The BRaCE framework provides novel systems and methods for dealing with non-determinism introduced in a computer system.

In general, formal methods specify properties of the DUT that can be definitively proven by analysis of an RTL (register transfer language) netlist, which is the DUT design in the form of an RTL description. The properties are shown to hold under a given set of assumptions, or constraints that the formal tool uses to prove design correctness.

In general, BRaCE provides a simple way for users to specify time-bounded cause and effect relationships. Given these cause and effect pairs, BRaCE uses a graph representation to determine whether or not the observed DUT behavior is possibly correct. Using BRaCE, the user authors two files. The first file describes the effects to be used in the test. This allows the user to define any sort of operations the user desires. The second file is the properties file, which describes the cause and effect relationships along with the target storage elements, race rules, and operands. Each target can be allocated its own BRaCE solver, which uses the cause descriptions to enqueue new events. Events have an associated active window which defines at what time the effect may be observed and how long it may take to be observed. When an event becomes active, it is inserted into the permuter engine, which is tasked with determining all of the possible solutions for a given observation, the most common of which is a change in the target value. When an event leaves its active window, it is considered expired and will not be considered for further solving. As observations are solved for, a solution graph is built up. When portions of graph contain only expired events, they may be solved and committed. A solver will not be considered EMPTY until all of its events have been solved and committed.

FIG. 1 illustrates a functional block diagram of a simulation environment 100, according to some embodiments. Simulation environment 100 includes a logical generator 102 and physical driver 104 that includes bus functional models (BFMs) to create artificial stimulus that drives the design under test (DUT) 106. Additionally, a monitor 108 is coupled to DUT 106 that monitors the DUT signals. As the simulation environment 100 stimulates the DUT 106, it predicts the expected behavior via an integrated functional model of the DUT commonly referred to as a scoreboard 110 that is coupled between the physical driver 104 and the monitor 108. The scoreboard 110 can often mimic functional or hardware behavior without replicating its RTL implementation, but there are times when this becomes an onerous task. In various embodiments, the scoreboard 110 provides a self-checking environment which predicts the DUT's expected behavior via an integrated functional model.

Figure 2A:
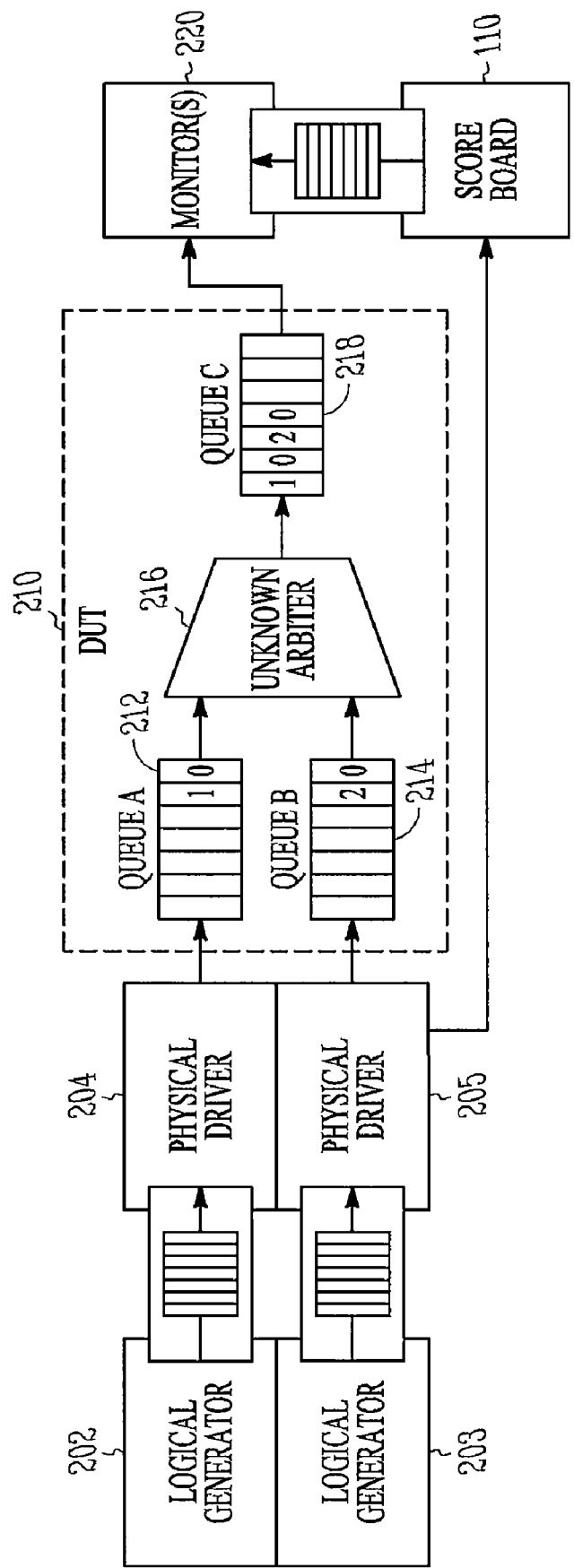
FIG. 2A illustrates a functional block diagram of a simulation environment to verify total ordering in an unknown arbiter, according to some embodiments.

FIG. 2A illustrates a simulation environment, according to some embodiments of the invention. FIG. 2A shows an example DUT 210 having an arbiter 216 with a random arbitration policy fed by two queues (A and B) represented as 212 and 214, the contents of which it interleaves in some unknown order and outputs into a third queue, (queue C) 218. In this example, the simulation environment includes a generator/driver pair 202, 204 and 203, 205 (which are responsible for stimulating the design) for each of the two input queues that drive stimulus into the DUT while concurrently forwarding it to a scoreboard 110 where expected results are computed to be checked against actual results seen on the output of C. The generator determines the logical stimulus to be driven (i.e., READ X) while the driver converts this logical message into the correct sequence of signals to be driven into the DUT.

When the data stored in queues A and B are mutually exclusive it is relatively easy to determine precisely where data has been moved from when it is observed on queue C's output interface, based only on its value. However, when data is allowed to alias between two input queues, additional non-determinism results, further complicating the self checking test environment. Consider a verification algorithm used to validate that the output stream viewed from queue C is any total ordering of the input streams from queues A and B that does not violate the original per-stream ordering. Since the arbitration policy is unknown, one cannot make any assumptions about the order in which transactions from different input streams are granted. The original scoreboard action of verifying every output based on its value in isolation is now inadequate as there will be instances where there is an insufficient amount of information present to make such determinations. However, deductive reasoning can be applied to the problem; for example, one can correctly deduce that an output stream of zero followed by two, as shown in FIG. 2A, infers that the zero output was received from queue B.

Memory-mapped registers (MMRs) are one type of storage element common in modern computer systems. Typically, they may be written by the user to configure the system, written by the system to log pertinent information, and/or read by the user to poll their contents.

Figure 2B:
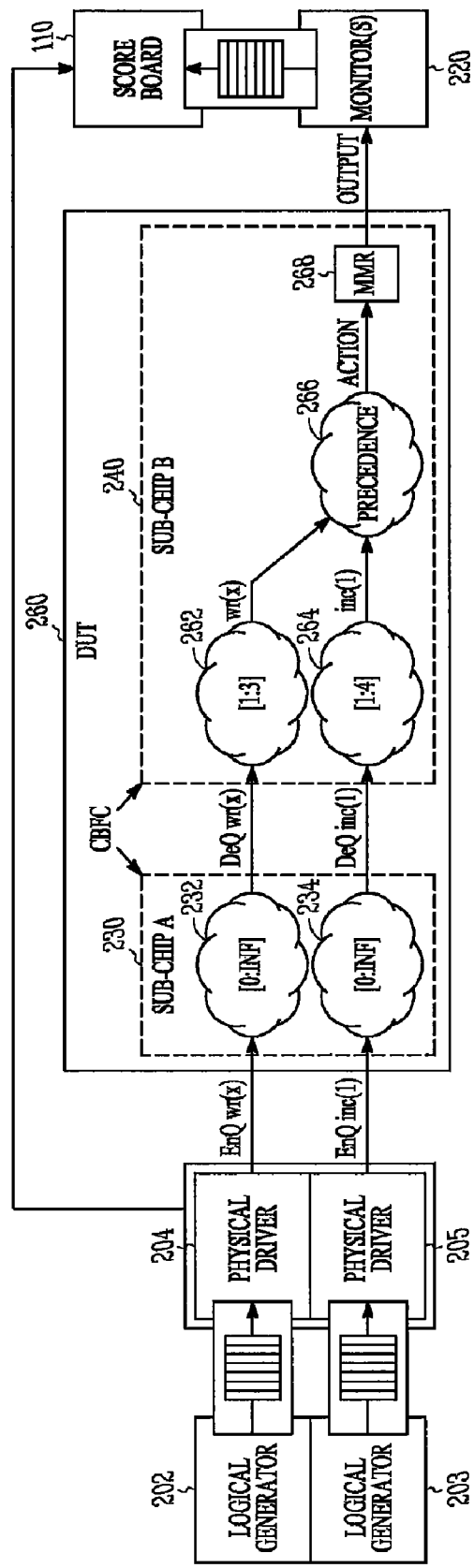
FIG. 2B illustrates a functional block diagram of simulation environment to verify the functionality of a memory-mapped register (MMR), according to various embodiments.

FIG. 2B illustrates a functional block diagram of simulation environment to verify the functionality of a DUT 260 having a memory-mapped register (MMR), according to various embodiments. DUT 260 in FIG. 2B contains an MMR 268 in sub-chip B 240 that is responsible for counting the number of times a particular packet is observed from sub-chip A 230. This MMR 268 can be modified by two independent data paths: the first increments the value of the register whenever the specific request is observed, and the second allows it to be written to a specified value. MMRs like the one just described are common in many designs and are often plagued by race conditions that exist between the various write data paths. Described herein, a novel simulation framework is provided that applies deductive reasoning in order to greatly simplify the verification of storage elements, such as MMRs, in spite of the non-determinism caused by race conditions.

Throughout the remainder of this document, target refers to the physical register state being verified. When a transition in the target's state is observed, a target event has taken place. A cause or causal event is any observable event with an associated consequence or effect. Every cause must have an associated effect defined; together the pair constitutes a property. A property instance refers to a specific observed cause and effect pairing in time. Property precedence 266 refers to the order that various property instances are applied to the target when solving is performed, based on their types. To support the common case where precedence is not clearly specified, BRaCE allows property precedence 234, 266 to be undefined, satisfying race conditions in one of n! ways, where n is the number of participants in the race.

It is unrealistic to assume that the temporal relationship from cause to effect is static or even fully deterministic; therefore, BRaCE adopts a relaxed latency model where users may specify an active window for each property that defines a bounded region of time in which a property instance's effect must be applied exactly once. Furthermore, BRaCE framework includes a built-in property instance scoreboard (in one example, a combination of 412, 413 and 415 from FIG. 4) that can be employed when using a causal sample point whose latency to the target MMR is prohibitively large or cannot be bounded. In some embodiments, four property instance states are defined; waiting, pending, active and expired. Property instances that are tracked in such a scoreboard are said to be waiting. When an instance is dequeued from the scoreboard (in one example, a combination of 412, 413 and 415 from FIG. 4), based on a second causal event, it enters the pending state, where it stays for a time equal to the lower bound of its active window. After being active for the duration of its active window, the instance expires.

In some embodiments, the BRaCE framework includes a decision tree that is used to track the possible solution space over time. Each vertice in the tree represents a potential solution; each level, the set of potential solutions for an instance in time; and each edge, a decision resulting in a new potential solution that exists later in time and is based on the parent solution and some set of observations. Furthermore, each solution includes the unused active effects and a decision stack.

Figure 2C:
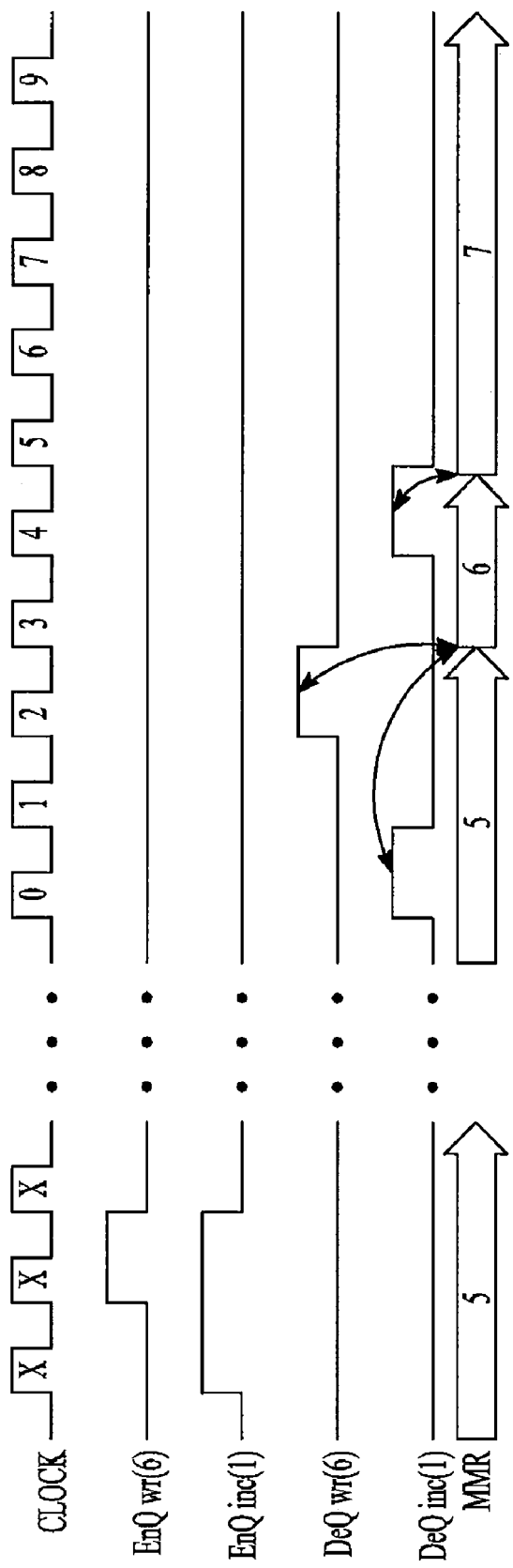
FIG. 2C illustrates a waveform demonstrating a potential race scenario with respect to FIG. 2B, according to some embodiments.

FIG. 2C illustrates an example waveform demonstrating a potential race scenario with respect to the example embodiments shown in FIG. 2B. FIG. 2C shows two increments that race with a single write of six. The first increment takes precedence over the write and is therefore applied first, logically. Even the limited amount of non-determinism presented in this example will add a substantial amount of additional work. In this case, the tracked solution space behaves as shown in FIG. 3

Figure 3:
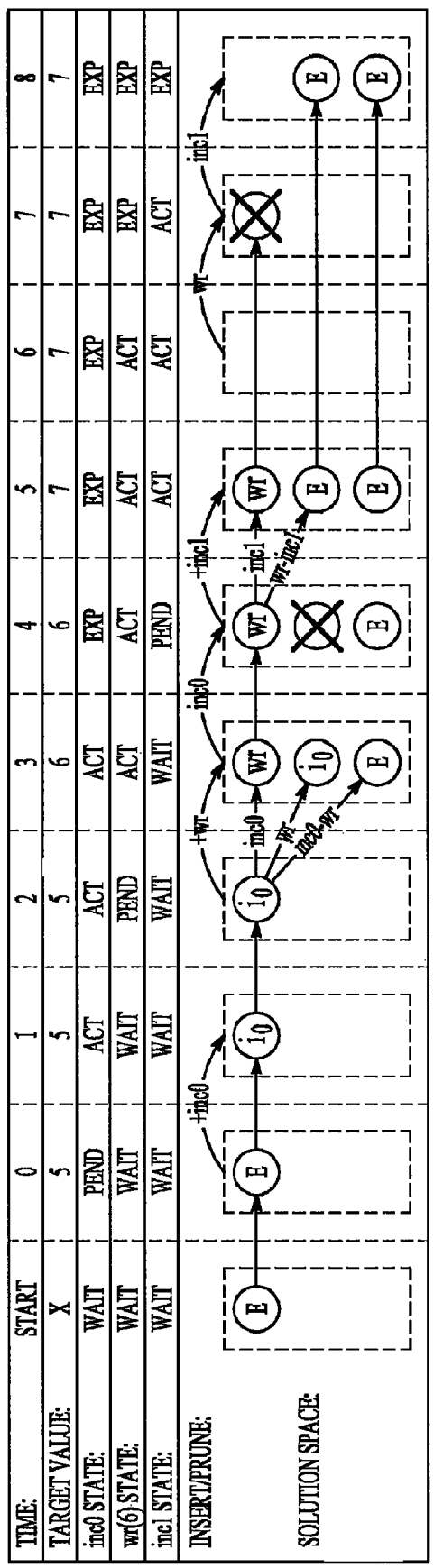
FIG. 3 illustrates a decision-tree based verification approach, according to some embodiments.

FIG. 3 illustrates a decision-tree based verification approach, according to some embodiments. In FIG. 3, a property instance is appended to each solution as an unused property instance when it is dequeued. Likewise, each instance is pruned from the solution space as it expires; taking with it any solutions that have failed to consume the instance. Therefore, potential solutions are those that consume each property instance exactly once within its active window. As long as the solution space is not empty, simulation may continue; otherwise, the overall satisfiability (SAT) problem is unsolved and simulation is terminated. From this example, it can be seen as to how the SAT problem has been effectively distributed, thereby solving it incrementally throughout time. In FIG. 3, E is abbreviates "Empty", i0 abbreviates "inc0", and wr abbreviates "wr(6)".

While the solution presented up to this point is theoretically sound and accomplishes the goal, there may be a scalability issue that has to be overcome. In FIG. 3, non-commutative effects, such as writes can result in exponential branching in the solution space. The following pseudo-code describes an algorithm according to various embodiments, in which details surrounding such things as property instance operands and solving steps are ignored in order to avoid obscuring the inventive subject matter.

```
1: while TRUE do
2:     SOLVE_NOW = 0
3:     for all I in PROP_INSTS do
4:         if i.state in (PEND, ACTIVE) then
5:             OLD_STATE = i.state
6:             NEW_STATE = i.tick
7:             if OLD_STATE ! = NEW_STATE then
8:                 if NEW_STATE = ACTIVE then
9:                     SOLVE_NOW =1
10:                    for all s in SOLUTIONS do
11:                        s.insert(i)
12:                    end for
13:                else
14:                    for all s in SOLUTIONS do
15:                        s.insert(i)
16:                    end for
17:                end if
18:            end if
19:        end if
20:    end for
21:    for all p in PROP_TYPES do
22:        if p.enq_cause then
23:            //enqueue new instance of p
24:        end if
25:        if p.deq_cause then
26:            //move next instance of p to PEND
27:        endif
28:    end for
29:        if tgt_saved != TGT then
30:    SOLVE_NOW = 1
31:        end if
32:    if SOLVE_NOW then
33:    SOLUTIONS_NEW .clear
34:        for all s in SOLUTIONS do
35:    SOLUTIONS_NEW .append (s.solve (TGT_SAVED, TGT))
36:        end for
37:    SOLUTIONS = SOLUTIONS_NEW
38:    TGT_SAVED = TGT
39:    ASSERT(!SOLUTIONS.empty, "Unsolvable");
40:    end if
41:    @CLOCK
42: end while
```

To reduce the likelihood of encountering combinatorial explosion, the amount of reordering and racing observable by the DUT may be constrained. Often it can be guaranteed that all property instance of the same type will be totally ordered with respect to one another. For verifying registers, the following set of default rules are enforced in some embodiments: property instances of the same type may not be reordered with respect to one another, property instances of different types may be infinitely reordered with respect to one another, property instances of the same type may not race one another, and a single property instance of any type may race a single property instance of any subset of the other types. The result of specifying such constraints can be dramatic when the searchable solution space with and without constraints is considered. For example, an active effect list that contains two types of effects, two effects of type A and 2 effects of type B, yields 65 ordered effect subsets without any constraints. However after applying the above rules this number shrinks to only 5 ordered subsets. These counts are derived using Equation (1), where n is the number of effects and effect types that are in the active state, respectively. Giving the user the capability of specifying property race constraints makes it desirable to modify the algorithm described previously. Specifically, the framework now continuously solves solutions derived through the consumption of non-empty property instance sets. Doing so allows handling the case where a property instance that can only be accounted for by a silent target transition, where the target's value remains constant, is initially prevented from doing so because of a specified constraint. A silent target transition is a means by which a cause can be accounted for without observing any visible effects; for example, a write of x to a register that already holds the value x can be satisfied by a so-called silent target transition.

$$\text{\# ordered\_subsets} = \sum_{k=0}^{n} \binom{n}{k} * k!, \quad \text{[Equation 1]}$$

In some embodiments, the BRaCE framework is implemented using the Synopsys OpenVera™ language. In various embodiments, the BRaCE framework can be implemented in any language that is capable of interfacing with RTL.

Figure 4:
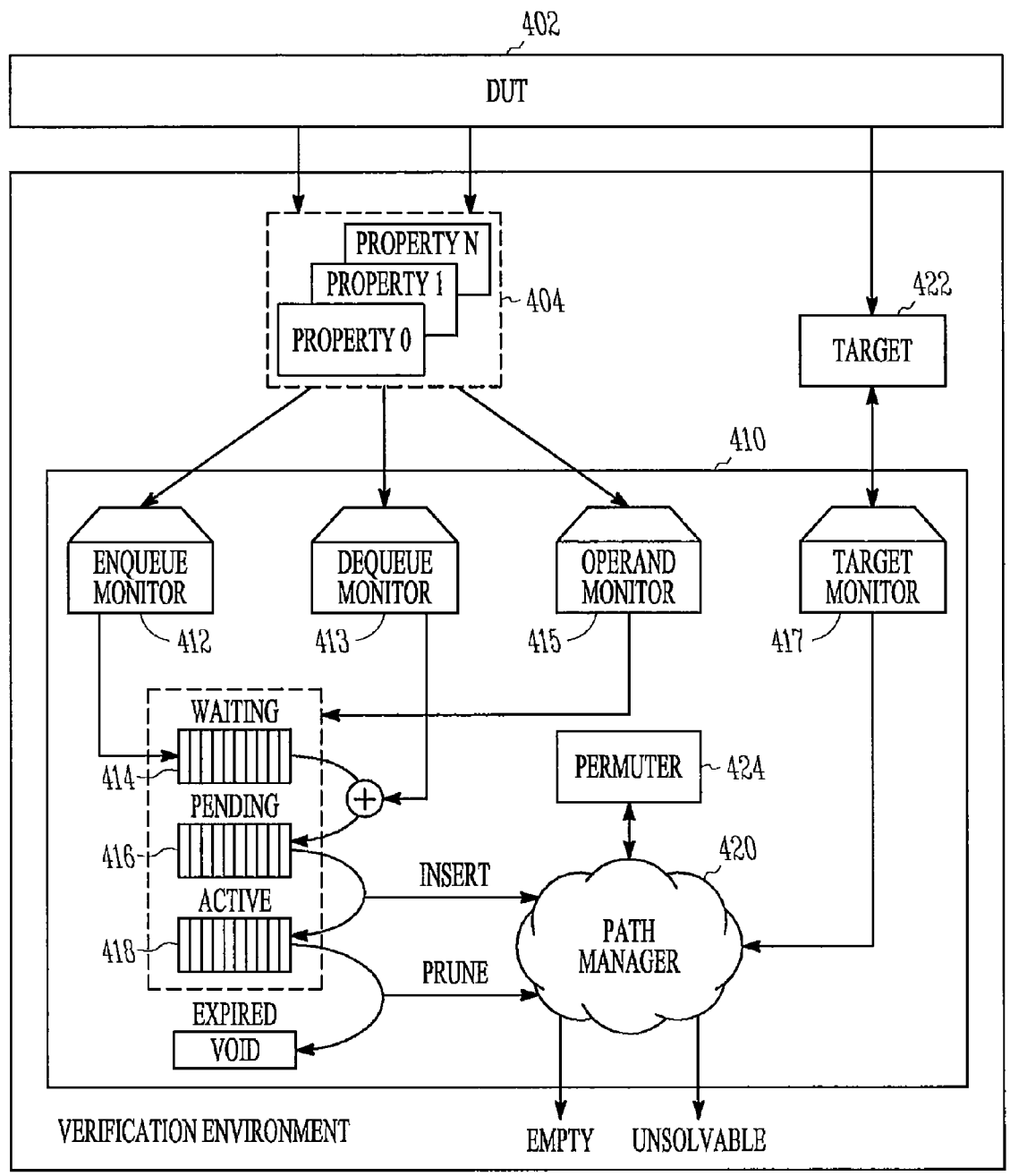
FIG. 4 illustrates a schematic of the internal structure of BRaCE implementation, according to some embodiments.

FIG. 4 illustrates a schematic of the internal structure of BRaCE implementation, according to some embodiments. FIG. 4 depicts a DUT 402 with a single BRaCE solver 410 connected to it, presumably being used to verify a storage element within the DUT 402. A user-defined array of properties 404 are defined, each including a property instance enqueue expression, a dequeue expression, and operands monitored by enqueue monitor 412, dequeue monitor 413 and operand monitor 415, respectively; among other things. These properties are observed by the BRaCE solver 410 and when satisfied, appropriate actions are taken; for example, the enqueue monitor 412 places a new property instance into the waiting state 414. Property instances in the waiting state 414 are stored and dequeued in FIFO order each time a dequeue expression is observed as satisfied. At this point, the instance is placed into the pending state 416 where it is held for a time specified by the lower-bound of its active window; the upper bound of the active window dictates how long the property instance will be kept in the active state 418. Whilst in the active state 418, property instances are accounted for in various ways by the path manager 420 which tracks the overall possible solution space. The path manager 420 is sensitive to both changes in the target 422 that is provided by target monitor 417 to be solved, dynamic operand value changes which can alter the result obtained by applying a property instance to the current target value, and the introduction of new property instances into the active state in the current time step, and the generation of non-empty solutions in the last time step. The path manager 420 uses the permuter engine 424 to explore the possible solution space. Once a property instance's active window has been observed, it is sent into the void as an expired property instance, for which at least one valid solution must exist that can account for the use of the instance. All solutions which fail to account for the expired property instance are discarded as invalid. In the event that there are no valid solutions left, the simulation fails. Simulation is allowed to complete only after all property instances have expired and the BRaCE solver 410 is effectively quiesced (in other words, the solution space has reached a state where everything is accounted for and nothing is active).

In some embodiments, a series of properties are registered with each solver, each of which includes one or more of the following: enqueue causal expression, dequeue causal expression, active window lower bound, active window upper bound, effect, and operands. These properties are constantly monitored by a BRaCE solver interface. When an enqueue expression is satisfied, an instance of the associated property is appended to the property instance waiting queue. Likewise, when the dequeue expression is satisfied, a single property instance of the associated type is moved from the waiting queue to the pending queue. After being pushed to the pending queue, a property instance's life cycle is determined by its bounded active window and ends with it being cast into oblivion as it expires. Upon expiration, the decision tree is pruned of any paths that have not already consumed the expired instance. In some embodiments, properties are allowed to have operands updated in one of three ways: once on the enqueue cause, or once on the dequeue cause, or on every edge of a specified clock. Each leaf of the solution space's internal decision tree can include two components: a decision stack and an active effect tree. The decision stack records the target transitions that various property instances have consumed to account for, and to aid in debugging. The active effect tree is a data structure that holds all of the currently pending effects. When trying to solve for a target transition, this tree is passed to a permuter engine, which performs a depth first traversal of the tree, applying all permutations of each effect subset to the old target value, looking for ordered subsets that result in the new value. A new leaf in the solution space's top level decision tree will be made for each successful unordered subset application. In other words, ordered effect subsets are applied in search of unordered subsets that meet a specific criterion: there is an ordering of this subset that satisfies the transition from an old value to a new one. This implementation is heavily reflected in the example from FIG. 3.

Figure 5:
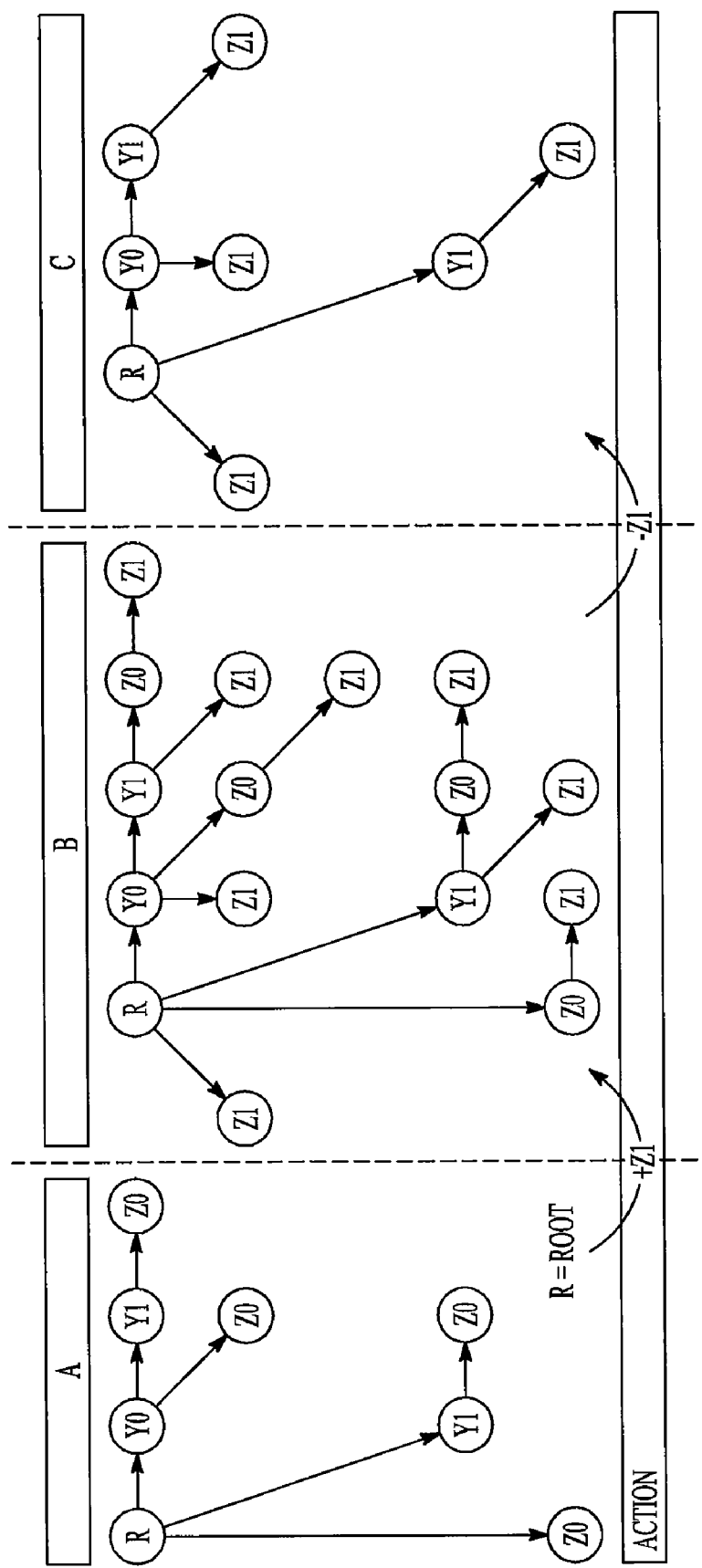
FIG. 5 shows how an active effect tree is manipulated upon effect insertion and usage or deletion, according to some embodiments.

FIG. 5 shows an example of how an active effect tree is manipulated upon effect insertion and usage or deletion, according to some embodiments. This example, begins with the tree shown in portion A of FIG. 5, which shows an active effect tree consisting of several instances of properties Y and Z. Portion B of FIG. 5, shows how the tree changes when a new instance of Z, Z1, is inserted. Finally, portion C of FIG. 5 shows the state of the tree after removing an instance of Z, Z0.

Figure 6:
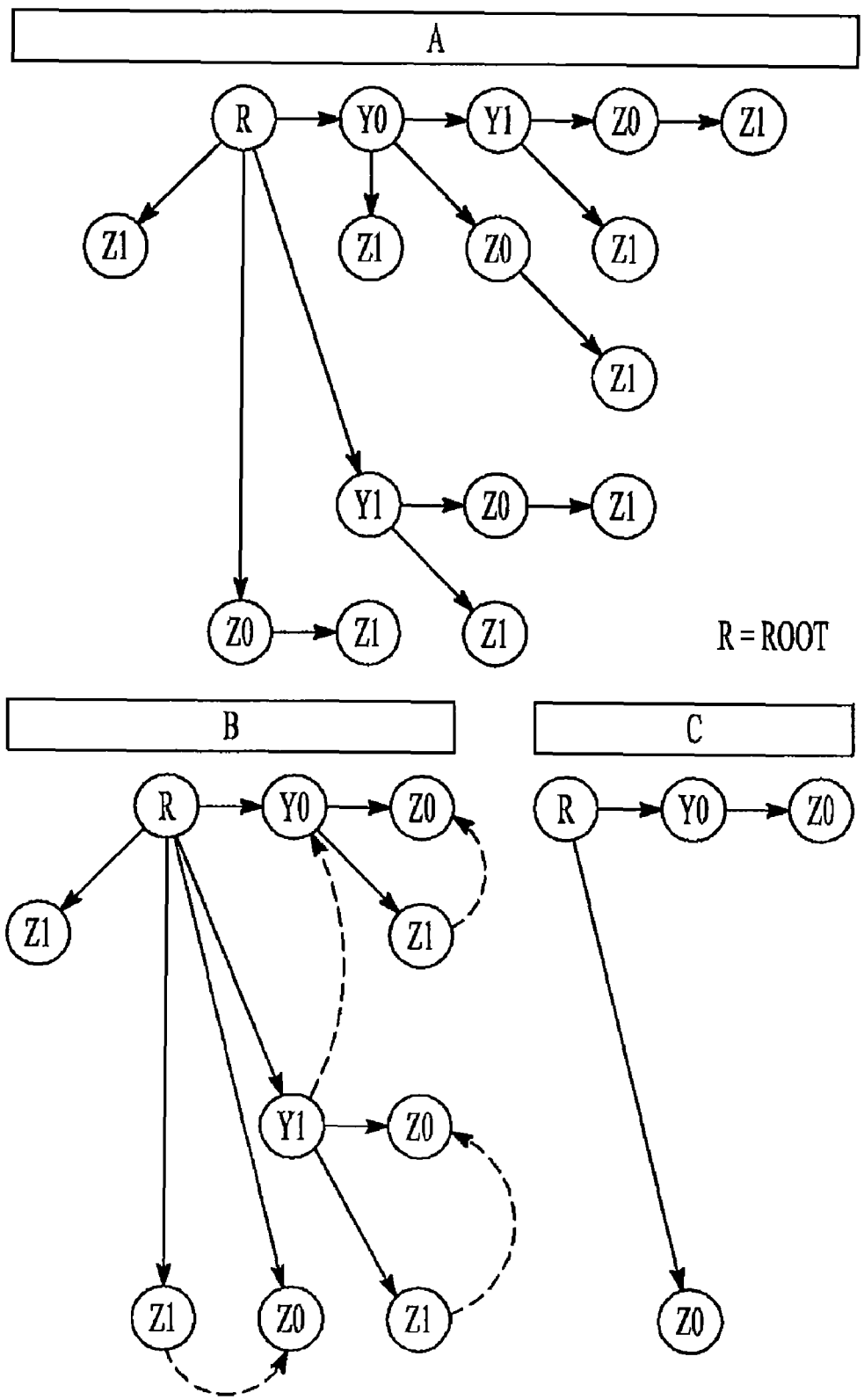
FIG. 6 illustrates the benefit of ordering and race constraints in an active effect tree, according to some embodiments.

FIG. 6 illustrates the benefit of ordering and race constraints in an active effect tree, according to some embodiments. In portion A of FIG. 6, an active effect tree is presented that has a size of fifteen (without the root node). Portion B of FIG. 6 shows the same tree after applying the default set of ordering and race constraints with ordering dependencies marked by dashed arcs. Finally, portion C of FIG. 6 demonstrates the effective instantaneous search space for solution sets. To appreciate the effect of using such constraints, consider the number of effect subsets in portion A of FIG. 6 versus portion C of FIG. 6. Applying Equation (1), it can be shown that there are 65 ordered subsets and 16 unordered subsets in portion A of FIG. 6 versus 5 ordered subsets that would be computed by the permuter engine in portion C of FIG. 6. These 5 ordered subsets are: {Y0, Z0}; {Z0, Y0}; {Y0}; {Z0}; and {EMPTY}. Lastly, a third constraint flavor is provided that allows the user to define the precedence relationships between the provided properties, further limiting the solution space to consider. If, for example, a precedence rule was added to give Y's precedence over Z's, {Z0, Y0} could be eliminated as a possible solution, leaving only 4 ordered subsets.

Figure 7:
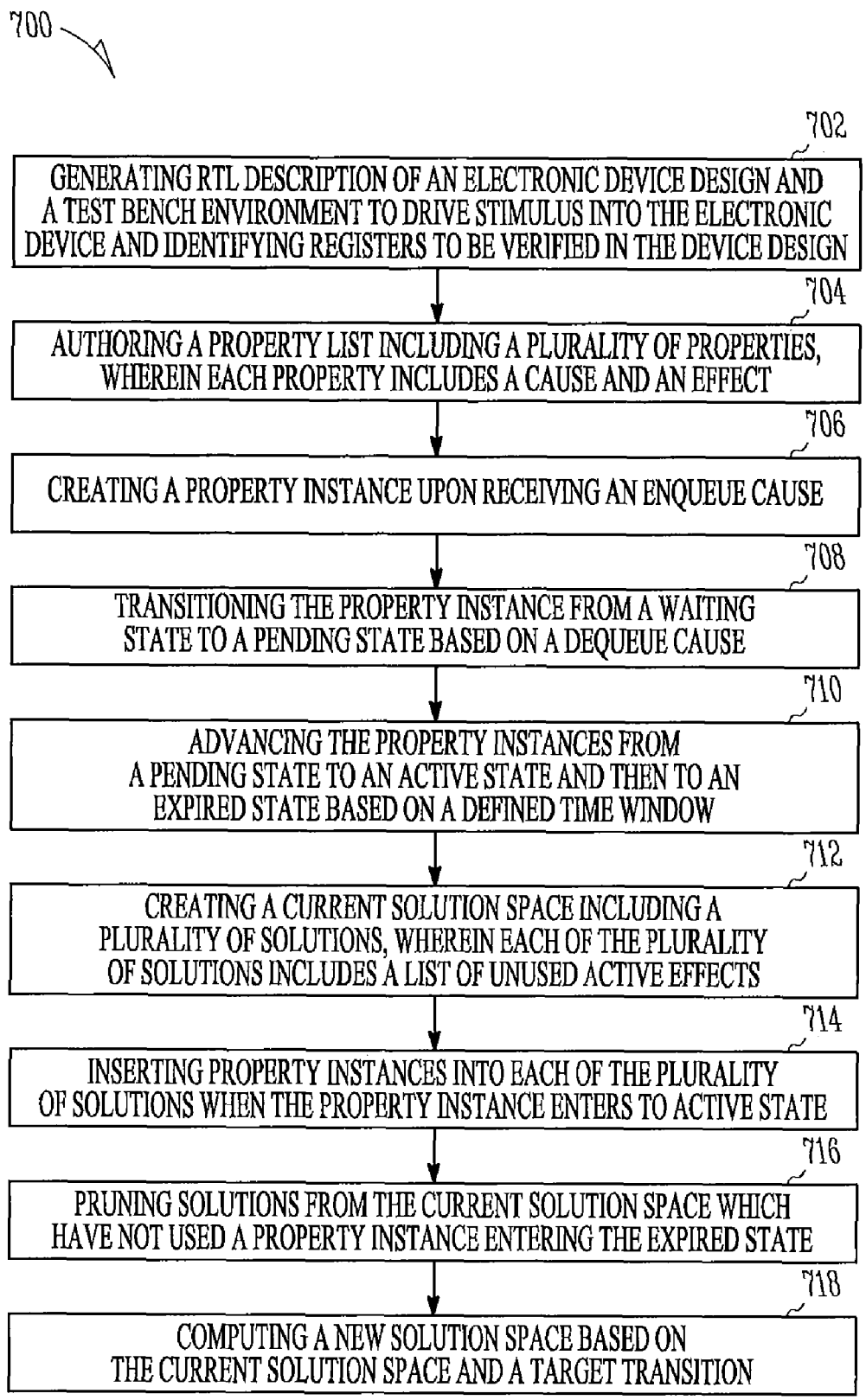
FIG. 7 illustrates a flowchart for a method for a verification framework for time-bounded race resolution, according to various embodiments.

FIG. 7 illustrates a flowchart for a method 700 for a verification framework for time-bounded race resolution, according to various embodiments. At block 702, method 700 includes receiving an RTL description of an electronic device design and a test bench environment to drive stimulus into the electronic device and identify registers to be verified in the device design. At block 704, method 700 includes receiving a property list including a plurality of properties, wherein each property includes a cause and an effect.

At block 706, method 700 includes creating a property instance upon receiving and enqueue cause. At block 708, method 700 includes transitioning the property instance from a waiting state to a pending state based on a dequeue cause. At block 710, method 700 includes advancing the property instances from a pending state to an active state and then to an expired state based on a defined time window. At block 712, method 700 includes creating a current solution space including a plurality of solutions, wherein each of the plurality of solutions includes a list of unused active effects. At block 714, method 700 includes inserting property instance into each of the plurality of solutions when the property instance enters to active state. At block 716, method 700 includes pruning solutions from the current solution space which have not used a property instance entering the expired state. At block 718, method 700 includes computing a new solution space based on the current solution space and a target transition.

In some embodiments, method 700 described herein further includes defining properties in the form of cause and time-bounded effect pairs that when obeyed demonstrate correct register behavior and when violated indicate errant register behavior. In some embodiments, method 700 includes defining a plurality of race rules to constrain which properties may be applied in a single time step in accounting for an observation. In some embodiments, method 700 includes defining a plurality of ordering rules to constrain how properties instances may be reordered in time with respect to one another.

In some embodiments, method 700 described herein includes defining a plurality of precedence rules to constrain what order property instances are applied when racing one another, for each of the identified register to be verified during the design test.

In some embodiments of method 700 described herein, the first description of a plurality of properties further includes identification of any required operands for each of the effects identified and determining the actual operation performed by the effect, based on the target's old value, constants, and operands.

In some embodiments, the method 700 described herein further includes determining the precise enqueue causal expression that instantiates a new property instance for each of the properties identified. In some embodiments, method 700 includes determining the precise dequeue causal expression that begins timing the next pending enqueued property instance according to its time bounds for each of the properties identified. In some embodiments, method 700 includes determining the window of time in which the effect is to be observed, with respect to the dequeue causal expression for each of the properties identified. In some embodiments, method 700 includes determining which effect definition properly describes the required effect for each of the properties identified. In some embodiments, method 700 includes defining any required operands, including their sample expressions and times for each of the properties identified. In some embodiments, method 700 includes determining if an unsolved property instance will prevent simulations from ending for each of the properties identified.

In some embodiments method 700 described herein comprises stimulating the design including interrogating all registered enqueue expressions, creating a new queued property instance when the associated enqueue expression is satisfied interrogating all registered dequeue expressions, moving the least recently queued property instance of appropriate type to the pending state and evaluating all property instances' operands, updating the values of those properties that he framework has determined should be updated. A registered enqueue expression is generally an expression that describes the conditions by which a specific property instance should be enqueued in the appropriate BRaCE solver. The fact that his expression exists indicated that it has been registered with the appropriate solver.

In some embodiments, method 700 described herein comprises advancing all property instances in either the pending or the active states. In some embodiments, method 700 comprises moving a property instance to the active state after its active window's lower bound has been satisfied. In some embodiments, method 700 comprises moving a property instance to the expired state after its active window's upper bound has been satisfied and terminating the simulation if a property instance has expired without being accounted for as part of a solution that both accounts for every expired property instance as well as every observed register value, simultaneously.

In some embodiments method 700 described herein comprises specifying a list of operands for each property, to be used in effect evaluation, wherein each operand includes an operand evaluation expression and a sampling type. In some embodiments, the method comprises providing the sampling type including sampling based on enqueue cause, wherein the operands are sampled when the property instance is originated based on the evaluation of an enqueue causal expression.

In some embodiments, method 700 described herein comprises providing the sampling type including sampling based on dequeue cause, wherein the operands are sampled when the property instance is moved into the pending state based on the evaluation of a dequeue causal expression.

In some embodiments, method 700 described herein comprises sampling dynamically, wherein the operands are sampled continuously. In some embodiments, the method provides receiving a set of property constraints, to be used for constraining the possible solution space, wherein specifying the set of property constraints includes providing at least one ordering rule to indicate the degree to which a property instances may be reordered.

In some embodiments of method 700 described herein receiving the set of property constraints includes receiving at least one race rule to indicate the degree to which a property instance can race another property. In some embodiments of the method described herein specifying the set of property constraints includes providing at least one precedence rule to indicate the order in which properties of various types must be applied when they are racing one another.

It should be noted that some or all the activities in the method 700 described in FIG. 7 may take place in an order other than described above, and some of the activities may take place in parallel with other activities in the method.

Figure 8:
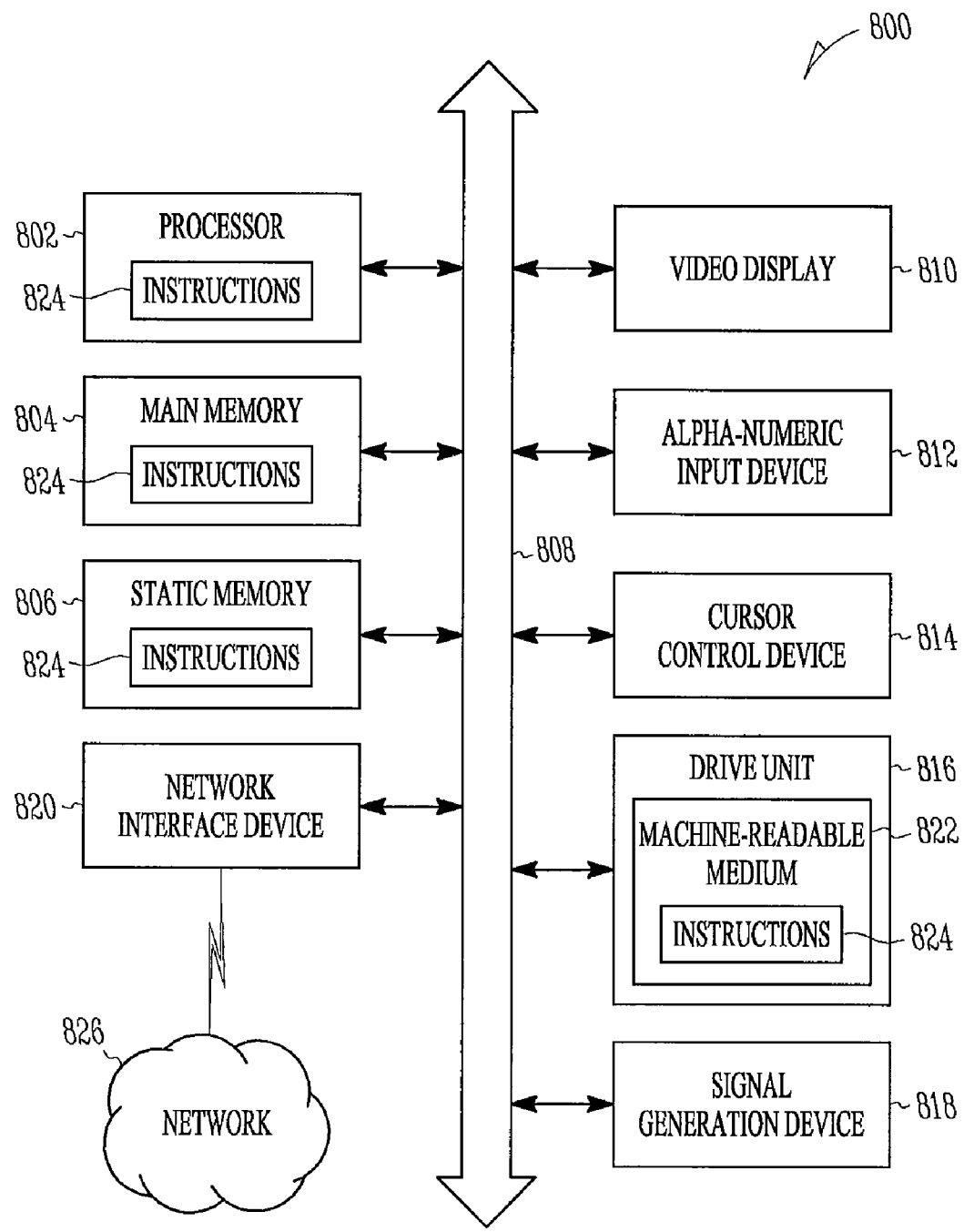
FIG. 8 illustrates a diagrammatic representation of a machine in the form of a computer system, according to an example embodiment.

FIG. 8 is a block diagram of a machine in the example form of a computer system 800, within which a set of instructions, when executed, performs the method described herein, according to some embodiments.

In some embodiments, the computer system 800 described herein may be a server computer, a client computer, a personal computer (PC), a tablet PC, a set-top box (STB), a Personal Digital Assistant (PDA), a cellular telephone, a web appliance, a network router, switch or bridge, or any machine capable of executing a set of instructions that specify actions to be taken by that machine. Further, while only a single machine is illustrated, the term "machine" shall also be taken to include any collection of machines that individually or jointly execute a set of instructions to perform any one or more of the methodologies discussed herein.

The example computer system 800 includes a processor 802 (e.g., a central processing unit (CPU) a graphics processing unit (GPU) or both), a main memory 804 and a static memory 806, which communicate with each other via a bus 808. The computer system 800 may further include a video display unit 810 (e.g., a liquid crystal display (LCD) or a cathode ray tube (CRT)). The computer system 800 also includes an alphanumeric input device 812 (e.g., a keyboard), a cursor control device 814 (e.g., a mouse), a disk drive unit 816, a signal generation device 818 (e.g., a camera sensor) and a network interface device 820. The disk drive unit 816 includes a computer-readable medium 822 on which is stored one or more sets of instructions 824 (e.g., software) embodying any one or more of the methodologies or functions described herein.

The software 824 may also reside, completely or at least partially, within the main memory 804 and/or within the processor 802 during execution thereof by the computer system 800, the main memory 804 and the processor 802 also constituting machine-readable media. The software 824 may further be transmitted or received over a network 826 via the network interface device 820.

While the computer-readable medium 822 is shown in an example embodiment to be a single medium, the term "machine-readable medium" should be taken to include a single medium or multiple media (e.g., a centralized or distributed database, and/or associated caches and servers) that store the one or more sets of instructions. The term "machine-readable medium" shall also be taken to include any medium that is capable of storing, encoding or carrying a set of instructions for execution by the machine and that cause the machine to perform any one or more of the methods of the various embodiments. The term "machine-readable medium" shall accordingly be taken to include, but not be limited to, solid-state memories, optical and magnetic media.

The above-described steps can be implemented using standard programming techniques. The novelty of the above-described embodiment lies not in the specific programming techniques but in the use of the methods described to achieve the described results. Software programming code which embodies the present application is typically stored in permanent storage. In a client/server environment, such software programming code may be stored in storage associated with a server. The software programming code may be embodied on any of a variety of known media for use with a data processing system, such as a diskette, or hard drive, or CD ROM. The code may be distributed on such media, or may be distributed to users from the memory or storage of one computer system over a network of some type to other computer systems for use by users of such other systems. The techniques and methods for embodying software program code on physical media and/or distributing software code via networks are well known and will not be further discussed herein.

It will be understood that each element of the illustrations, and combinations of elements in the illustrations, can be implemented by general and/or special purpose hardware-based systems that perform the specified functions or steps, or by combinations of general and/or special-purpose hardware and computer instructions.

These program instructions may be provided to a processor to produce a machine, such that the instructions that execute on the processor create means for implementing the functions specified in the illustrations. The computer program instructions may be executed by a processor to cause a series of operational steps to be performed by the processor to produce a computer-implemented process such that the instructions that execute on the processor provide steps for implementing the functions specified in the illustrations. Accordingly, the figures support combinations of means for performing the specified functions, combinations of steps for performing the specified functions, and program instruction means for performing the specified functions.

While there has been described herein the principles of the application, it is to be understood by those skilled in the art that this description is made only by way of example and not as a limitation to the scope of the application. Accordingly, it is intended by the appended claims, to cover all modifications of the application which fall within the true scope of the claimed subject matter.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the various embodiments of the present invention. Therefore, it is intended that the inventive subject matter be limited only by the claims and the equivalents thereof.

What is claimed is:

1. A method comprising:
   receiving an Register Transfer Level (RTL) description of an electronic device provided for a design test;
   receiving a test bench environment to drive stimulus into the electronic device;
   identifying at least one register to be verified during the design test;
   receiving a property list including a plurality of properties, wherein each property includes a cause and an effect;
   creating a new property instance of a property in the property list upon receiving an enqueue cause, the new property instance added to a set of property instances;
   transitioning a property instance in the set of property instances from a waiting state to a pending state based on a dequeue cause;
   advancing a property instance in the set of property instances from the pending state to an active state and then to an expired state based on a defined time window;
   creating a current solution space including a plurality of solutions, wherein each of the plurality of solutions includes a list of unused active effects;
   inserting a property instance from the set of property instances into each of the plurality of solutions when the property instance enters to active state;
   pruning solutions from the current solution space which have not used a property instance entering the expired state; and
   computing, by one or more computer processors a new solution space based on the current solution space and a target transition.

2. The method of claim 1, further comprising:
   receiving a plurality of properties defined as cause and time-bounded effect pairs that when obeyed demonstrate correct register behavior and when violated indicate errant register behavior;
   receiving a plurality of race rules defined to constrain which properties can be applied in a single time step in accounting for an observation;
   receiving a plurality of ordering rules defined to constrain how properties instances can be reordered in time with respect to one another; and
   receiving a plurality of precedence rules defined to constrain what order property instances must be applied when racing one another, for each of the identified register to be verified during the design test.

3. The method of claim 1, wherein receiving the first description of a plurality further comprising:
  identifying any required operands for each of the effects identified; and
  determining the actual operation performed by the effect, based on the target's old value, constants, and operands.

4. The method of claim 1, wherein the method includes, for each of the properties identified:
  determining the enqueue causal expression that instantiates a new property instance;
  determining the dequeue causal expression that begins timing the next pending enqueued property instance according to associated time bounds;
  determining a window of time in which the effect is to be observed, with respect to the dequeue causal expression;
  determining an effect definition that describes the effect;
  receiving a definition of operands, including their sample expressions and times; and
  determining if an unsolved property instance must prevent simulations from ending.

5. The method of claim 1, further comprising:
  interrogating all registered enqueue expressions and creating a new queued property instance when the associated enqueue expression is satisfied;
  interrogating all registered dequeue expressions, moving the least recently queued property instance of appropriate type to the pending state; and
  evaluating property instances' operands and updating the values of those for which it is determined to do so.

6. The method of claim 5, further comprising:
  advancing all property instances in either the pending or the active states.

7. The method of claim 6, further comprising:
  moving a property instance to the active state after its active window's lower bound has been satisfied;
  moving a property instance to the expired state after its active window's upper bound has been satisfied; and
  terminating the simulation if a property instance has expired without being accounted for as part of a solution that simultaneously accounts for expired property instance and observed register value.

8. The method of claim 1, further comprising:
  receiving a list of operands for each property to be used in effect evaluation, wherein each operand includes an operand evaluation expression and a sampling type.

9. The method of claim 8, further comprising:
  providing the sampling type including sampling based on enqueue cause, wherein the operands are sampled when the property instance is created based on the evaluation of an enqueue causal expression.

10. The method of claim 8, further comprising:
  providing the sampling type including sampling based on dequeue cause, wherein the operands are sampled when the property instance is moved into the pending state based on an evaluation of a dequeue causal expression.

11. The method of claim 8, further comprising
  sampling dynamically, wherein the operands are sampled continuously.

12. The method of claim 1, further comprising:
  receiving a set of property constraints, to be used for constraining the possible solution space.

13. The method of claim 12, wherein receiving the set of property constraints includes receiving at least one ordering rule to indicate the degree to which a property instances can be reordered.

14. The method of claim 12, wherein receiving the set of property constraints includes receiving at least one race rule to indicate the degree to which a property instance can race another property instance.

15. The method of claim 12, wherein specifying the set of property constraints includes providing at least one precedence rule to indicate the order in which properties of various types must be applied when they are racing one another.

16. A non-transitory computer-readable medium encoded with computer-readable instructions which, when executed, will perform a method comprising:
  generating RTL description of an electronic device provided for a design test and a test bench environment to drive stimulus into the electronic device;
  identifying at least one register to be verified during the design test and authoring a property list including a plurality of properties, wherein each property includes a cause and an effect;
  creating a new property instance of a property in the property list upon receiving an enqueue cause, the new property instance added to a set of property instances;
  transitioning a property instance in the set of property instances from a waiting state to a pending state based on a dequeue cause;
  advancing a property instance in the set of property instances from the pending state to an active state and then to an expired state based on a defined time window;
  creating a current solution space including a plurality of solutions, wherein each of the plurality of solutions includes a list of unused active effects;
  inserting a property instance from the set of property instances into each of the plurality of solutions when the property instance enters to active state;
  pruning solutions from the current solutions space which have not used a property instance entering the expired state; and
  computing a new solution space based on the current solution space and target transition.

17. The non-transitory computer-readable medium of claim 16 encoded with computer-readable instructions which, when executed, will perform the method comprising:
  interrogating all registered enqueue expressions, creating a new queued property instance when the associated enqueue expression is satisfied;
  interrogating all registered dequeue expressions, moving the least recently queued property instance of appropriate type to the pending state; and
  evaluating all property instances' operands, updating the values of those for which it is required to do so.

18. The non-transitory computer-readable medium of claim 16 encoded with computer-readable instructions which, when executed, will perform the method comprising:
  identifying any required operands for each of the effects identified; and
  determining the actual operation performed by the effect, based on the target's old value, constants, and operands.

19. The non-transitory computer-readable medium of claim 16 encoded with computer-readable instructions which, when executed, will perform the method comprising:
  interrogating all registered enqueue expressions, creating a new queued property instance when the associated enqueue expression is satisfied;
  interrogating all registered dequeue expressions, moving the least recently queued property instance of appropriate type to the pending state; and
  evaluating all property instances' operands, updating the values of those for which it is required to do so.

20. The non-transitory computer-readable medium of claim 19 encoded with computer-readable instructions which, when executed, will perform the method comprising:
advancing all property instances in either the pending or the active states;
moving a property instance to the active state after its active window's lower bound has been satisfied;
moving a property instance to the expired state after its active window's upper bound has been satisfied; and
terminating the simulation if a property instance has expired without being accounted for as part of a solution that both accounts for every expired property instance as well as every observed register value, simultaneously.

* * * * *